United States Patent [19]

Jiang et al.

[11] Patent Number: 4,654,829
[45] Date of Patent: Mar. 31, 1987

[54] PORTABLE, NON-VOLATILE READ/WRITE MEMORY MODULE

[75] Inventors: Ching-Lin Jiang, Dallas; Robert D. Lee, Denton, both of Tex.

[73] Assignee: Dallas Semiconductor Corporation, Dallas, Tex.

[21] Appl. No.: 682,701

[22] Filed: Dec. 17, 1984

[51] Int. Cl.⁴ .......................................... G11C 13/00
[52] U.S. Cl. .................................... 365/229; 365/226; 365/189; 371/66
[58] Field of Search ....................... 365/229, 221, 226; 235/492, 380; 371/66

[56] References Cited

U.S. PATENT DOCUMENTS

| | | | |
|---|---|---|---|
| 4,145,760 | 3/1979 | Ward et al. | 365/226 |
| 4,256,955 | 3/1981 | Giraud et al. | 235/380 |
| 4,381,458 | 4/1983 | Anstey et al. | 307/66 |
| 4,408,119 | 10/1983 | Decavele | 235/380 |
| 4,449,206 | 5/1984 | Tokitsu et al. | 365/229 |

FOREIGN PATENT DOCUMENTS 1549307  7/1979  United Kingdom .
2067018  7/1981  United Kingdom .

OTHER PUBLICATIONS

Mostek MK3805N, Preliminary Data Sheet from Mostek 1982/1983 Microelectronic Data Book.
Motorola MC68HC68R1 and MC68HC68R2, Advance Information Data Sheet Printed 5-84.
National Semiconductor COP499/COP399, Low Power CMOS Memory Data Sheet.
Mostek Application Note Entitled NMOS RAM Offers Non-Volatility with DATASAVE.
Catalyst Research Corporation Data Sheet for NVRM 1A Non-Volatile RAM Module.
Mostek MK48Z02, CMOS RAM Data Sheet.
Article from Businessweek, Oct. 15, 1984, Entitled "How 'Smart' Cards Can Outwit the Credit Crooks".

Primary Examiner—Terrell W. Fears
Attorney, Agent, or Firm—David N. Leonard

[57] ABSTRACT

A portable, non-volatile read/write memory module includes a battery for providing standby power that is coupled to a monolithic integrated circuit. Five terminals of the module are removably connected to a host electronic system for transfer of data to and from the module. One of the terminals is a chip enable input that may optionally be used for providing operating power to the monolithic integrated circuit. The monolithic integrated circuit further includes control circuitry that may optionally be coded for providing a security feature for access to data stored in the memory module.

6 Claims, 11 Drawing Figures

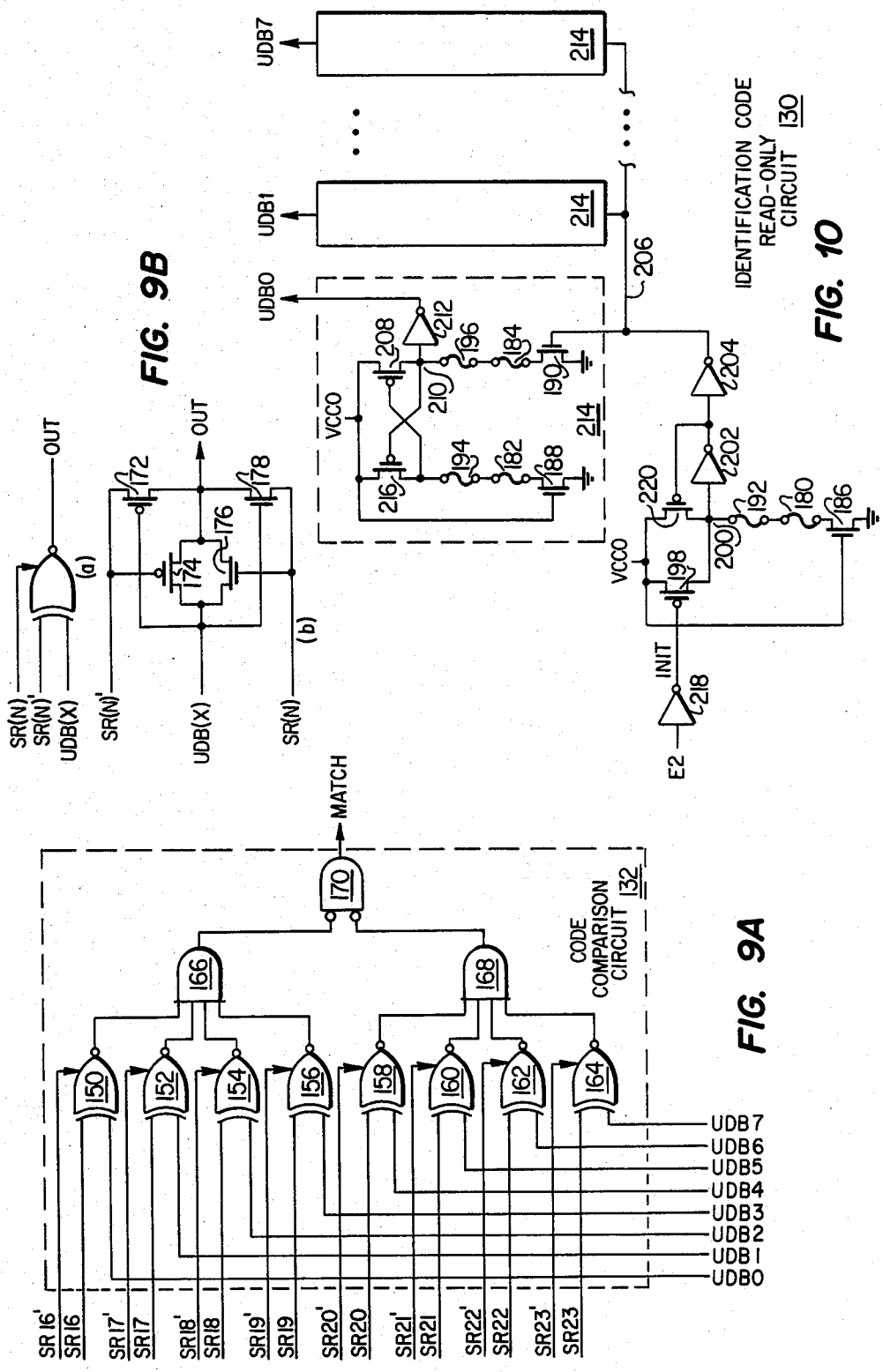

PORTABLE, NON-VOLATILE READ/WRITE MEMORY MODULE

REFERENCE TO RELATED APPLICATION

Reference is made to a related application entitled Space-Saving Back-up Power Supply, Ser. No. 660,937 filed Oct. 15, 1984, in the names of Smith, Jr., et al. The '937 application discloses and claims a module for providing battery back-up to an electronic circuit such as a large scale integrated circuit memory.

TECHNICAL FIELD

The present invention generally relates to electronic systems and, more particularly, is concerned with apparatus for providing a non-volatile read/write memory module.

BACKGROUND OF THE INVENTION

An easily-portable and non-volatile read/write memory module or cartridge is useful in many electronic applications. Such applications include ones in which it is advantageous to physically associate electrically-stored information or data with a tangible object that may be moved from place to place. In such applications, the function of the portable memory is similar to that of a tag. For ease of interconnection, compactness, and reliability, it is desirable that a portable memory module have a minimum number of terminals for removable connection to a host electronic system. Another useful feature for a portable memory module is a means for preventing unauthorized access to the data stored in the module.

In the past, various portable, non-volatile memory modules or cartridges have been devised. One such cartridge comprises a plastic housing having mounted therein a read-only memory integrated circuit mounted on a printed circuit board. Electrical terminals of the read-only memory integrated circuit are connected via conductors on the printed circuit board to terminals on an edge of the printed circuit board. The edge terminals of the printed circuit board are recessed in an opening at one side of the plastic housing and are adapted to be plugged into a multi-pin socket of a host electronic system. This cartridge requires connection to more than twenty terminals. Moreover, data cannot be electrically written to the memory of such a cartridge.

Other non-volatile memories include EPROMS (ultraviolet light erasable and electrically programmable read-only memories) and EEPROMS (electrically erasable and electrically programmable read-only memories). The long time typically required to modify data or information stored in such memories is unacceptable for certain applications.

Non-volatile memory modules having read/write memory (RAM) have also been devised. One such portable, non-volatile memory includes lithium batteries piggybacked onto a 2K×8 static CMOS RAM which is packaged in a 24-pin dual-in-line package. Such a package—having a large number of exposed pins or terminals—is not well-suited for portable use.

The above-described prior art memory modules typically require connection from the host electronic system to considerably more than five terminals of the module. It is advantageous, however, to have a smaller number of required terminals. For a reduced number of terminals, serially-accessible RAMS have been devised. One such memory is a CMOS static RAM organized 128×8 and packaged in an 8-pin dual-in-line package with no battery attached and with no standby power control logic included therein. Data is transferred to and from the RAM using synchronous serial communication. Seven pins of the package are utilized: an operating power supply input pin, a ground pin, a serial clock pin, two chip-enable pins, a data-input pin, and a data-output pin. The first 8-bit byte serially transferred after the chip is enabled is an input command byte that defines the starting RAM address and whether subsequent transfers are to be reads or writes. For multiple transfers (burst mode) the RAM address automatically increments as long as the RAM remains enabled. For this memory module, no provision is made to prevent unauthorized access.

It is known in the prior art that further pin or terminal reduction can be accomplished by combining the input and output pins into a single I/O pin. Additionally, it is heretofore known to provide only one chip enable input rather than two. Furthermore, it should be apparent that the serial clock input pin could be eliminated if asynchronous serial communication, rather than synchronous, were desirable or acceptable for a particular application.

None of the above-mentioned prior art approaches for portable, non-volatile memory, however, have proposed elimination of the operating power supply input pin. In this regard, it is important to distinguish an operating power supply input from a standby power supply input. In connection with providing non-volatility to a RAM integrated circuit, it has been proposed in the prior art to eliminate a standby power supply input pin by using a write enable pin to provide standby power; a conventional power supply input pin, though, provides operating power whenever the RAM is not in the standby mode.

In accordance with the foregoing, a need exists for a portable, non-volatile read/write memory module having a reduced number of pins or terminals for interconnection to a host electronic system. A need also exists for preventing unauthorized access to data stored in such a memory module

SUMMARY OF THE INVENTION

The present invention provides a portable, non-volatile read/write memory module having as few as five terminals for interconnection to a host electronic system. This small number of required terminals for interconnection is advantageous in the packaging of the memory module into a miniature, rugged, and low-cost package.

In an alternative embodiment of the invention, the number of required terminals for interconnection is further reduced by eliminating a separate operating power supply input terminal.

Another feature of the invention is the provision of security whereby electronic circuitry is provided for preventing unauthorized reading or writing of data stored in the module.

The memory module of the present invention includes a battery connected to a monolithic integrated circuit for providing standby power to the monolithic integrated circuit The monolithic integrated circuit includes: a serially-accessible read/write data storage means for the storage and retrieval of data; a chip enable input terminal and chip enable circuitry; a primary power supply input terminal for providing operating power to the data storage means whenever the voltage of the primary power supply input terminal is greater than that of the battery; and comparator and switching circuitry which is automatically operative to select the chip enable input terminal as the source of operating power to the data storage means if both of the following conditions are satisfied: (1) the voltage of the primary power supply input is less than that of the battery, and (2) the voltage of the chip enable input terminal is greater than that of the battery. The monolithic integrated circuit may additionally or alternatively include: circuitry for receiving a serial sequence of data bits representative of an identification code; circuitry for comparing the received sequence of bits to a predetermined bit code; and circuitry responsive to the result of such comparison for enabling the writing and reading of data to and from the read/write data storage means.

As is apparent from the foregoing summary, it is a general object of the present invention to provide a novel and improved portable, non-volatile read/write memory module.

Other objects and advantages, and a more complete understanding of the invention may be obtained by referring to the following detailed description of a preferred embodiment when taken in conjunction with the accompanying drawings

BRIEF DESCRIPTION OF THE DRAWINGS

FIGS. 9A-9B are logic and circuit functional diagrams of a code comparison circuit utilized in the control logic circuit of FIG. 8.

FIG. 10 is a logic and circuit functional diagram of an identification code read-only circuit utilized in the control logic circuit of FIG. 8.

DETAILED DESCRIPTION OF A PREFERRED EMBODIMENT

Figure 1:
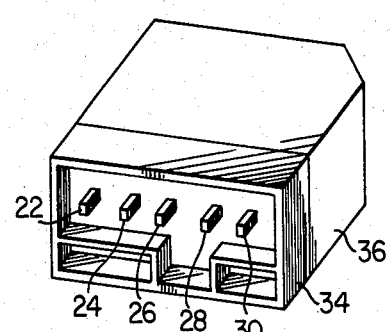
FIG. 1 is a perspective view of an assembled portable, non-volatile read/write memory module according to one aspect of the invention.

A hand-held, portable, non-volatile read/write memory module 20 according to the invention is shown in FIG. 1. For use as an electronic tag, it is desirable that the memory module 20 be small, rugged, low-cost, have a small number of connector terminals, and be protected against unauthorized and inadvertent access. The present preferred embodiment has a width of approximately 0.6 inches, a length of approximately 0.7 inches, and a thickness of approximately 0.3 inches. The memory module 20 includes a set of terminals 22, 24, 26, 28, and 30 adapted for removably making electrical connection to nodes of a host electronic system 32 (not shown in FIG. 1). Front and rear housing pieces 34 and 36 are made of plastic and function as a protective outer shell for the memory module 20.

Figure 2:
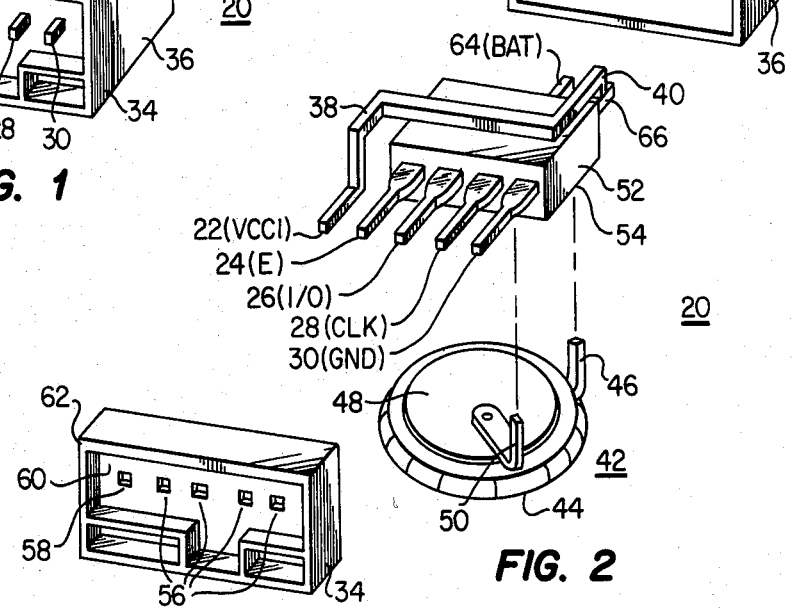
FIG. 2 is an exploded perspective view of the memory module of FIG. 1.

An exploded view of the memory module 20 is shown in FIG. 2. The memory module 20 includes a specially-shaped metal piece 38, an end portion of which comprises the terminal 22. In the preferred embodiment, the metal piece 38 has a formed end portion 40. In an alternative embodiment, the metal piece 38 is eliminated.

Also included in the memory module 20 is a battery 42. In the preferred embodiment, the battery 42 is a standard 3-volt lithium cell manufactured by Ray-O-Vac as model BR1225. The battery 42 has a positive terminal 44 to which is spot-welded a metal tab 46. The battery 42 has a negative terminal 48 to which is spot-welded a metal tab 50.

The memory module 20 further includes a monolithic integrated circuit 52 which is housed in a dual-in-line integrated circuit package 54. Four pins along one side of the integrated circuit package 54 comprise the terminals 24, 26, 28, and 30. Each of the terminals 24, 26, 28, and 30 extends in a straight manner in a plane parallel to the longitudinal ends of the body of the integrated circuit package 54 and, when the memory module 20 is assembled, passes through a corresponding aperture 56 in the front housing piece 34. The terminal 22 of the metal piece 38 similarly passes through an aperture 58 of the front housing piece 34. The apertures 56 and 58 are located in a wall 60 of the front housing piece 34. The wall 60 is sufficiently recessed from front edge 62 of the front housing piece 34 so as to prevent the terminals 22, 24, 26, 28, and 30 from extending beyond the plane of the front edge 62. The integrated circuit package 54 additionally has terminals 64 and 66 which are located on the opposite side from the terminals 24, 26, 28, and 30. Each of the terminals 24, 26, 28, 30, 64, and 66 are interconnected within the integrated circuit package 54 to the monolithic integrated circuit 52.

The terminal 66 is electrically connected by conventional soldering to the formed end portion 40 of the metal piece 38. The terminal 64 is electrically connected by conventional soldering to the metal tab 46, thereby making electrical connection to the positive terminal 44 of the battery 42. Similarly, the terminal 30 is electrically connected by conventional soldering to the metal tab 50, thereby making electrical connection to the negative terminal 48 of the battery 42.

After the monolithic integrated circuit 52 is electrically connected to the metal piece 38 and to the battery 42, the terminals 22, 24, 26, 28, and 30 are inserted through the apertures 58 and 56 of the front housing piece 34. A measured amount of a liquid encapsulating material such as Axicon XT-5038-9 insulation compound (not shown) is dispensed into the cavity of the rear housing piece 36 and the front housing piece 34 is next fitted to the rear housing piece 36—the battery 42, the monolithic integrated circuit 52, and the metal piece 38 being located in the partially-filled cavity of the rear housing piece 36. The liquid encapsulating material flows around the other elements in the cavity and is caused to become solidified by curing.

Figure 3:
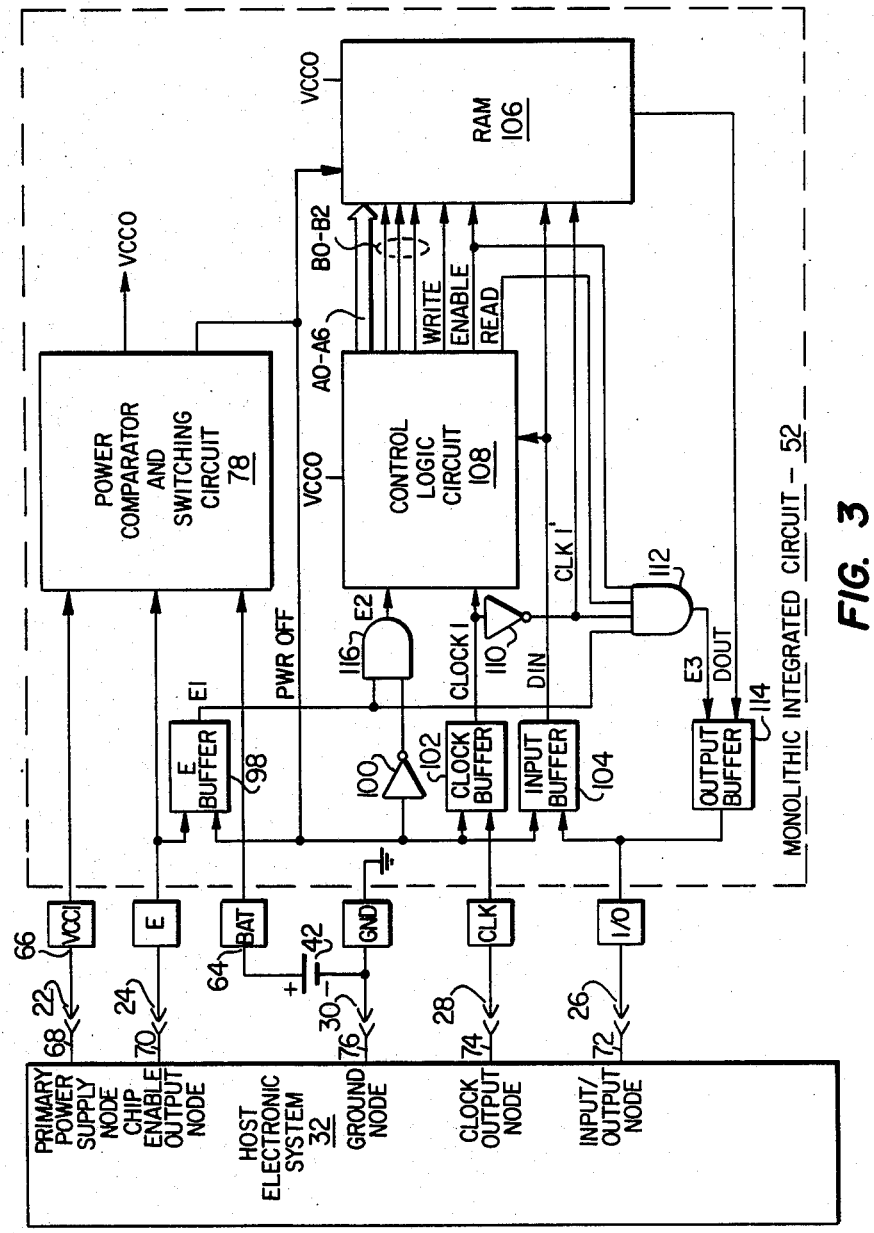
FIG. 3 is a block and logic functional diagram illustrating a monolithic integrated circuit utilized in the memory module of FIGS. 1 and 2, and illustrating interconnection of the monolithic integrated circuit to a battery of the memory module and to a host electronic system.

FIG. 3 illustrates interconnection of the monolithic integrated circuit 52 to the battery 42 and to electrical nodes of the host electronic system 32. The terminal 22 is removably connected (in the manner of a plug and socket) to a primary power supply node 68 of the host electronic system 32. Similarly, the terminal 24 is removably connected to a chip enable output node 70, the terminal 26 to an input/output node 72, the terminal 28 to a clock output node 74, and the terminal 30 to a ground node 76.

The primary power supply node 68 provides a voltage VCCI which typically is at 5.0 volts; the chip enable output 70 provides a chip enable signal E; the ground node 76 provides a ground voltage-reference GND; the clock output node 74 provides a signal CLK for synchronously clocking data to and from the monolithic integrated circuit 52; and the input/output node 72 provides or receives a signal I/O which is the data that is transferred to and from the monolithic integrated circuit 52. The battery 42 provides to the terminal 64 a voltage herein designated as voltage BAT.

The monolithic integrated circuit 52 includes a power comparator and switching circuit 78 for providing a signal PWROFF and an output designated herein as VCCO. In addition to GND, which is coupled to all circuits of the monolithic integrated circuit 52, the voltage VCCI and the chip enable signal E and the voltage BAT are coupled to inputs of the power comparator and switching circuit 78. The power comparator and switching circuit 78 compares the voltages of these three inputs and automatically couples one of the three inputs to VCCO through one of three switching transistors. The voltage VCCI is coupled to VCCO if the voltage VCCI is greater than the voltage BAT. Alternatively, the chip enable signal E is coupled to VCCO if (1) the voltage VCCI is less than the voltage BAT and (2) the voltage of the chip enable signal E is greater than the voltage BAT. In the further alternative, the voltage BAT is coupled to VCCO if both the voltage VCCI and the voltage of the chip enable signal E are less than the voltage BAT. With the exception of two comparators within the power comparator and switching circuit 78, VCCO is utilized to power all circuits of the monolithic integrated circuit 52.

The monolithic integrated circuit 52 may be either in an operating mode or in a standby mode. To be in the operating mode, either the voltage VCCI or the chip enable signal E must be at a voltage greater than that of the voltage BAT. Under such conditions the signal PWROFF is a logic 0 (a voltage at or near GND). Conversely, when both the voltage VCCI and the chip enable signal E are at voltages less than that of the voltage BAT, the signal PWROFF is a logic 1 (a high voltage); for this condition the monolithic integrated circuit 52 is in the standby mode, receiving standby power from the battery 42 through the terminal 64.

From the foregoing description of the power comparator and switching circuit 78, it should be apparent that, for an alternative embodiment, the terminal 22 and its associated voltage VCCI may be completely eliminated (and eliminating any need for the metal piece 38) if the chip enable output node 70 is designed to be capable of providing sufficient operating voltage and current to power the monolithic integrated circuit 52 in its operating mode. The monolithic circuit 52 in the preferred embodiment is implemented with CMOS circuitry and requires the chip enable output 70 typically provide less than 16 mA at 3.8 volts. (If, however, the voltage VCCI of typically 5.0 volts is provided, then the chip enable output node 70 normally is not used as a source of power and is only required to typically provide less than 0.25 mA at a logic 1 state.)

Figure 4:
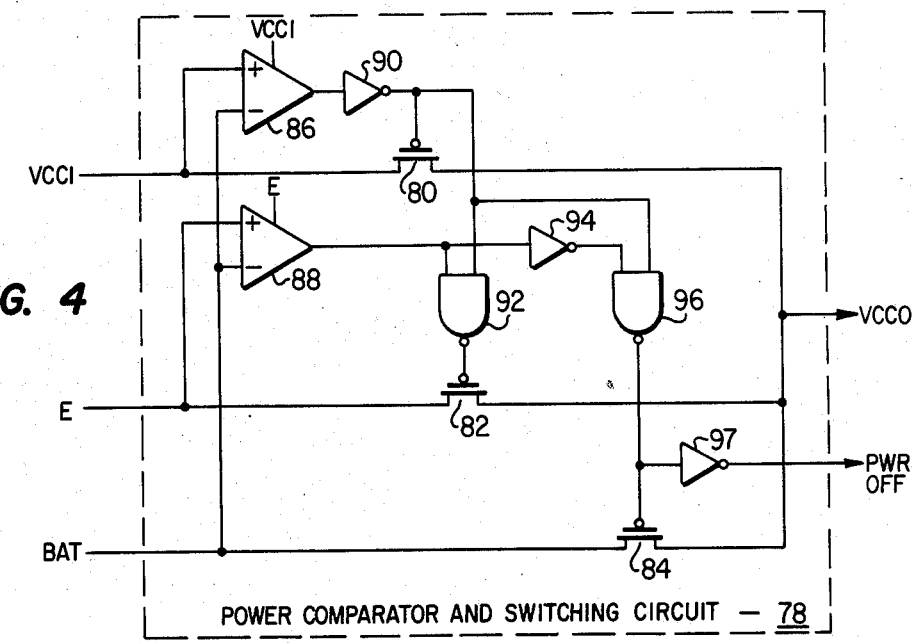
FIG. 4 is a circuit functional diagram illustrating a power comparator and switching circuit utilized in the monolithic integrated circuit shown in FIG. 3.

Referring to FIG. 4, there is illustrated a circuit functional diagram of the power comparator and switching circuit 78. Included therein are three P-channel transmission transistors 80, 82, and 84, with each having its drain coupled to VCCO. As illustrated, the sources of the P-channel transmission transistors 80, 82, and 84 are respectively coupled to the voltage VCCI, the chip enable signal E, and the voltage BAT. A voltage comparator 86, a voltage comparator 88, and logic gates 90, 92, 94, and 96 cooperate to cause one of the three P-channel transmission transistors 80, 82, and 84 to become conductive, thereby coupling to VCCO in the heretofore-described manner either the voltage VCCI, the chip enable signal E, or the voltage BAT. Each of the P-channel transmission transistors 80, 82, and 84 is made to have a large width to length ratio in order to minimize the voltage drop across whichever one of the three transistors is conductive.

Although all other circuitry of the monolithic integrated circuit 52 is powered from VCCO, the voltage comparator 86 is powered from VCCI and the voltage comparator 88 is powered from the chip enable signal E. The voltage comparator 86 and the voltage comparator 88 are of conventional design.

When the state of the output of the logic gate 96 is a logic 0 the P-channel transmission transistor 84 is conductive and the signal PWROFF produced at the output of an inverter 98 is a logic 1.

Referring again to FIG. 3, it can be seen that the signal PWROFF is input to an E buffer 98, an inverter 100, a clock buffer 102, an input buffer 104, and a RAM 106. The signal PWROFF causes the E buffer 98 to be unresponsive to the chip enable signal E, the clock buffer 102 to be unresponsive to the signal CLK, the input buffer 104 to be unresponsive to the signal I/O, and the RAM 106 to be unresponsive to a signal designated herein as ENABLE which is output from a control logic circuit 108.

The clock buffer 102 produces a signal CLK1 at its output. The signal CLK1 is forced to a logic 1 state whenever the signal PWROFF is a logic 1. An inverter 110 is responsive to the signal CLK1 for generating a signal CLK1' which is input to an AND gate 112. The AND gate 112 is responsive to an enable signal E1 produced by the E buffer 98, to the signal CLK1', to a signal READ which is produced by the control logic circuit 108, and to the signal ENABLE, for producing an output enable signal E3 which is applied to an output buffer 114. Whenever the signal E3 is a logic 0, the output of the output buffer 114 is caused to be in a high impedance state.

An AND gate 116 is responsive to the enable signal E1 and to the output of the inverter 100 for producing a signal E2 which is utilized to enable the control logic circuit 108. The control logic circuit 108 is responsive to the signal E2, to the signal CLK1, and to a signal DIN for controlling the transfer of data to and from the RAM 106. The input buffer 104 is responsive to the signal PWROFF and to the signal I/O for producing the signal DIN. The control logic circuit 108 provides byte address signals A0, A1, A2, A3, A4, A5, A6 and bit address signals B0, B1, B2, and a signal WRITE, as well as the previously mentioned signal ENABLE and the signal READ.

The RAM 106 is addressed as a conventional 1024×1 RAM but, as utilized in the monolithic integrated circuit 52, may be conceptually regarded as being organized into 128, 8-bit bytes, and wherein each 8-bit byte is serially transferred to or from the RAM 106. The byte address signals A0–A6 determine which one of the 128 bytes is to be written or read, and the bit address signals B0–B2 determine which bit within the addressed byte is accessed for writing or reading. The signal WRITE is a logic 1 when data is to be written to the RAM 106, and the signal ENABLE is a logic 1 when data is either to be written to or to be read from the RAM 106.

The signal DIN provides data to be written to the RAM 106. Data is input to the RAM 106 on the falling edge of the signal CLK1', which corresponds to the rising edge of the signal CLK. For a read operation from the RAM 106, the RAM 106 provides an output signal DOUT to the output buffer 114. The output buffer 114 is responsive to the signal E3 and to the signal DOUT for providing output data to the terminal 26.

The control logic circuit 108 provides a security feature for controlling the serial transfer of data to and from the RAM 106. The chip enable signal E must transition from a logic 0 to a logic 1 as the first step for gaining access to the RAM 106. The immediately following 24 transitions from a logic 0 to a logic 1 of the signal CLK will cause data applied to the terminal 26 (the signal I/O) to be input via the signal DIN to the control logic circuit 108. In this manner, 24 data bits that comprise an instruction command are received.

Figure 5:
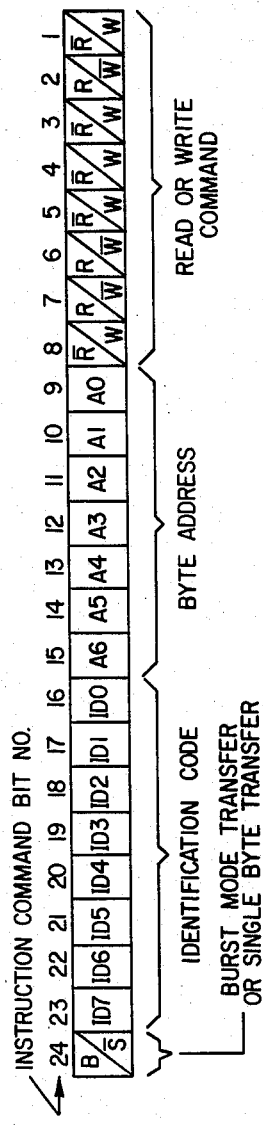
FIG. 5 is a symbolic representation of the command format utilized in the monolithic integrated circuit of FIG. 3.

Referring now to FIG. 5, there is illustrated a symbolic representation of the instruction command format utilized in the monolithic integrated circuit 52. The first 8 bits of the 24-bit sequence define whether the operation following receipt of the instruction command will be a read, a write, or no operation. The bit pattern for a read (the right-most bit being the first received) is 01100010 and for a write is 10011101. Any other received pattern will result in no access to the RAM 106.

The instruction command bit 24 (the last-received bit of the instruction command) defines whether a read or write transfer to be performed following receipt of the instruction command is to be a single byte transfer or a burst mode transfer. For a single byte transfer, the bit 24 must be a logic 0; for a burst mode transfer, the bit 24 must be a logic 1.

For a single byte transfer, the instruction command bits 9 through 15 define the address of the byte of the RAM 106 which is to be accessed for reading or writing. For a burst mode transfer, each of the instruction command bits 9 through 15 is required to be a logic 0. In the burst mode, reading or writing commences at byte address 0. After the 8 bits of a byte of the RAM 106 have been serially transferred, the byte address automatically increments by 1 for transfer of the next byte. In this manner, all 128 consecutive bytes of the RAM 106 may be serially read or written. Fewer than all of the 128 bytes can be transferred by causing the chip enable signal E to transition from a logic 1 to a logic 0 before all 128 bytes have been transferred.

A security feature is provided in conjunction with instruction command bit 16 through bit 23. These 8 bits comprise an identification code that is compared to a predetermined bit code stored in the control logic circuit 108. Access to the RAM 106 for reading or writing is enabled only if the instruction command identification code matches the predetermined bit code. If the code does not match, it is required that the chip enable signal E return to a logic 0 and transition again to a logic 1 prior to any transfer of data to or from the RAM 106.

Figure 6:
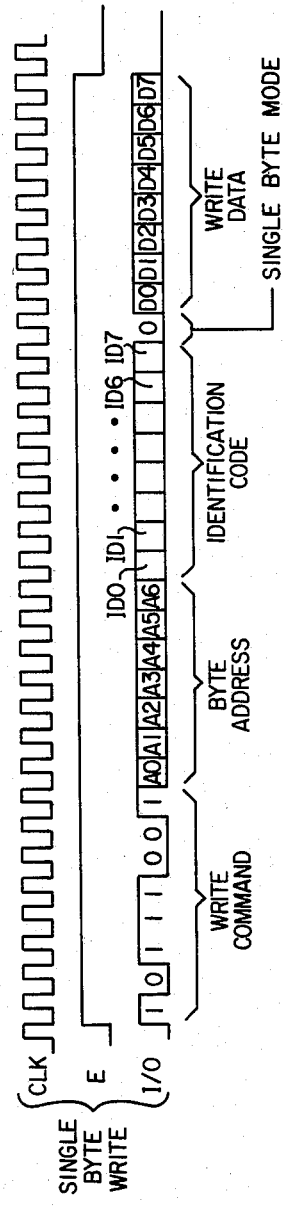
FIG. 6 is a set of waveforms illustrating the basic timing of single byte write command for the monolithic integrated circuit of FIG. 3.

Referring to FIG. 6, the timing relationship between the signal CLK, the chip enable signal E, and the signal I/O for a single byte write is illustrated. Input of the instruction command and the write data is synchronous; the signal I/O is sampled by the control logic circuit 108 on the rising edge (transition from a logic 0 to a logic 1) of the signal CLK.

Figure 7:
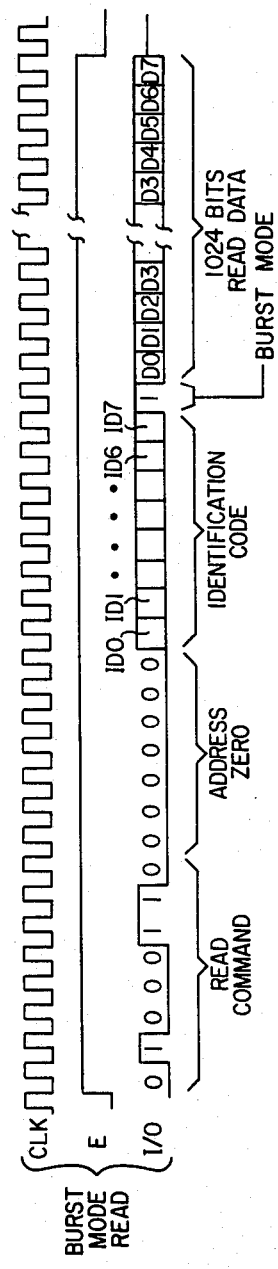
FIG. 7 is a set of waveforms illustrating the basic timing of a burst mode read command for the monolithic integrated circuit of FIG. 3.

The timing relationship of the signal CLK, the chip enable signal E, and the signal I/O for a burst mode read is illustrated in FIG. 7. As with the single byte write, the 24-bit instruction command is synchronously input after the chip enable signal E transitions from a logic 0 to a logic 1. The portion of the signal I/O that comprises the instruction command is sampled on the rising edge of the signal CLK, but data is output on the falling edge of the signal CLK.

Figure 8:
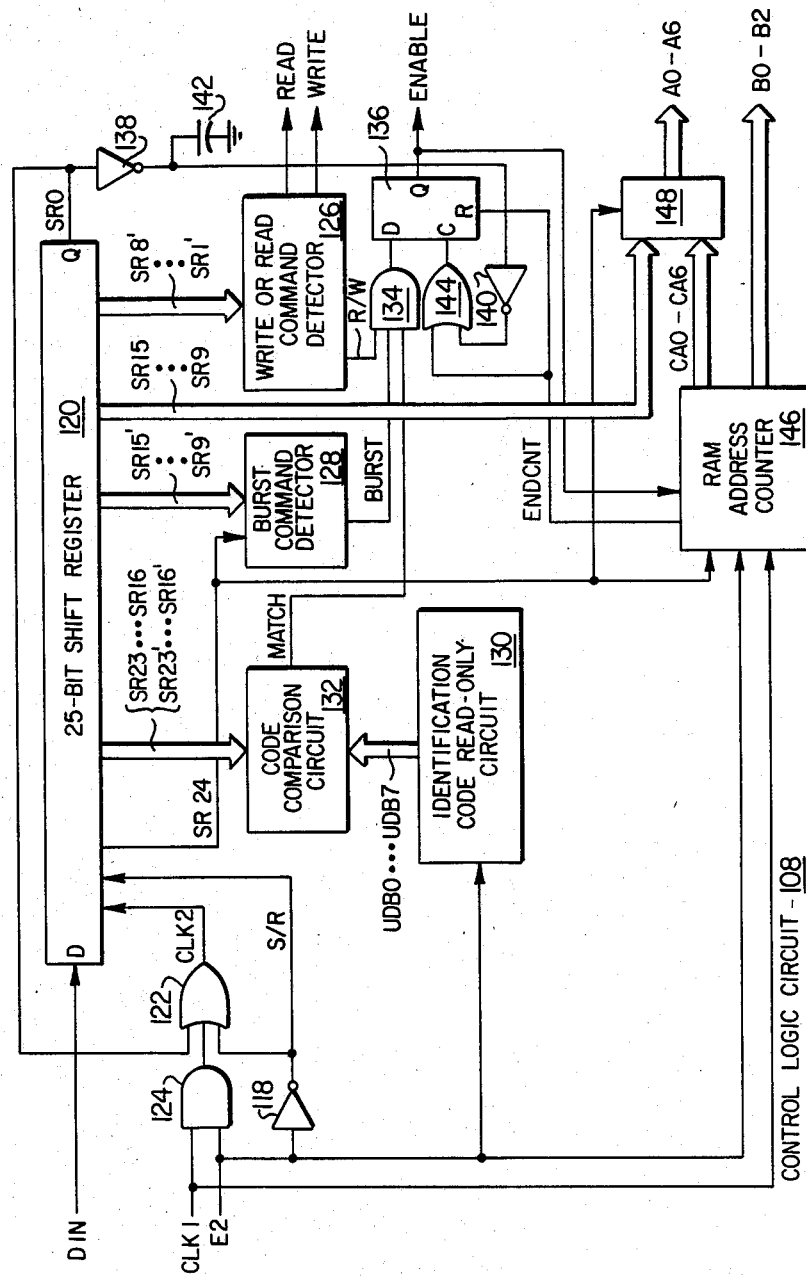
FIG. 8 is block and logic functional diagram of a control logic circuit utilized in the monolithic integrated circuit of FIG. 3.

Referring to FIG. 8, a block and logic functional diagram of the control logic circuit 108 is illustrated. The state of the signal E2 is a logic 0 when either the chip enable signal E is a logic 0 or the signal PWROFF is a logic 1. When the signal E2 is a logic 0, an inverter 118 causes the state of its output signal S/R to be a logic 1. Signal S/R is input to a 25-bit shift register 120. The 25-bit shift register 120 is comprised of 25 conventional master/slave D-type clocked latches, each of which has a D-input and Q and Q' outputs. The Q output of the right-most bit provides a signal SRO; the Q' outputs of the next right-most 8 bits provide signals SR1' through SR8'; the Q and Q' outputs of the next 15 bits provide output signals SR9 through SR23 and SR9' through SR23', respectively; and the Q output of the left-most bit provides a signal SR24.

As is conventional, with the exception of the D-input of the left-most bit and the Q-output of the right-most bit, the Q output of a bit is coupled to the D-input of the immediately right adjacent bit. Within each bit, data at the D-input is sampled by the master when a signal CLK2 is a logic 0, and is clocked from the master to the slave when the signal CLK2 transitions to a logic 1. Each master of the right-most 24 bits has a reset input and the master of the left-most bit has a set input. These set and reset inputs are coupled to the output of the inverter 118. The output of the inverter 118 additionally is coupled to an input of an OR gate 122 and, accordingly, causes the signal CLK2 which is provided by the OR gate 122 to be a logic 1 whenever the signal S/R is a logic 1. Consequently, the bits comprising the 25-bit shift register 120 are responsive to a logic 1 state of the signal S/R for presetting the Q output of the left-most bit to a logic 1 state and the other 24 bits of the 25'-bit shift register 120 to a logic 0 state.

After the signal E2 becomes a logic 1, an AND gate 124 and the OR gate 122 are responsive to the signal CLK1 for generating the signal CLK2 which causes the logic 1 state which is initially stored in the left-most bit position to be shifted to the right from register to register of the 25-bit shift register 120 as the instruction command is serially received via the signal DIN. After 24 cycles of the signal CLK2, the signal SRO will transition from a logic 0 state to a logic 1 state. Because the OR gate 122 receives the signal SRO as an input, further clocking of the 25-bit shift register 120 is inhibited until the signal SRO later is caused to become a logic 0 by the resetting action of the signal S/R.

Conventional logic comprising a write or read command detector 126 is responsive to the signals SR1' through SR8' for generating the signal READ, the signal WRITE, and a signal R/W. The signal R/W is a logic 1 when the write or read command detector 126 detects either a valid read or a valid write command. Similarly, a burst command detector 128 is responsive to the signals SR24 and SR9' through SR15' for generating a signal BURST. The signal BURST is a logic 1 only if the signals SR24 and SR9' through SR15' are all at a logic 1 or if the signal SR24 is a logic 0 (in which case the signals SR9' through SR15' are don't-cares with regard to generating a logic 1 for the signal BURST).

An identification code read-only circuit 130 generates signals UDB0 through UDB7. A code comparison circuit 132 is responsive to the signals UDB0 through UDB7 and to the signals SR16' through SR23' and to the signals SR16 through SR23 for generating a signal MATCH. The signal MATCH is a logic 1 only if the bit pattern represented by the signals UDB0 through UDB7 is identical to the bit pattern represented by the signals SR16 through SR23.

An AND gate 134 is responsive to the signals R/W, BURST, and MATCH for generating a logic 1 at the D-input to a clocked latch 136 after a sequence of data bits comprising a valid instruction command has been received and stored in the 25-bit shift register 120. Inverters 138, 140 and a capacitor 142 are responsive to the signal SRO for generating a signal CLK3. The signal CLK3 is delayed relative to the signal applied to the D-input of the clocked latch 136 and, thus, (through an OR gate 144) is effective to clock the D-input logic state to the Q output of the clocked latch 136. The Q output of the clocked latch 136 provides the signal ENABLE.

A RAM address counter 146 is responsive to the signals E2, CLK1, SR24, and ENABLE for providing signals B0, B1, B2 and a set of signals CA0 through CA6. The signals B0, B1, B2, and CA0 through CA6 provide a binary count sequence that changes at the rate of the signal CLK1. As previously mentioned, the signals B0 through B2 are utilized in serially addressing the bits within the addressed byte of the RAM 106. The byte address for the RAM 106 is provided by the signals A0 through A6 which are output from an address multiplexor 148. The signal SR24 causes the address multiplexor 148 to select for the byte address the set of signals SR9 through SR15 for a single byte transfer instruction and causes the address multiplexor 148 to select the set of signals CA0 through CA6 for a series of byte addresses in conjunction with a burst mode transfer.

A logic 0 to logic 1 transition of a signal ENDCNT is generated by the RAM address counter 146 after 8 bits have been transferred in conjunction with a single byte transfer operation or after 128 bytes have been transferred in conjunction with a burst mode transfer operation. Also, the signal ENDCNT will transition to a logic 1 at any time that the signal E2 transitions from a logic 1 to a logic 0. The signal ENDCNT causes the gated latch 136 to immediately reset and the signal ENABLE to transition to a logic 0, thereby inhibiting any further reading or writing of the RAM 106 until the signal ENABLE once again is caused to transition to a logic 1 state in the aforesaid manner.

Referring to FIG. 9A, a logic functional diagram of the code comparison circuit 132 is illustrated. The code comparison circuit 132 includes exclusive-NOR gates 150, 152, 154, 156, 158, 160, 162, 164 and logic gates 166, 168, 170. FIG. 9B illustrates a circuit implementation (FIG. 9B(b)) of an exclusive-NOR gate (FIG. 9B(a)) as utilized in the code comparison circuit 132. Included therein are P-channel transistors 172, 174, and N-channel transistors 176, 178.

Referring to FIG. 10, a logic and circuit functional diagram of the identification code read-only circuit 130 as utilized in the control logic circuit 108 of FIG. 8 is illustrated. In the preferred embodiment, the identification code read-only circuit 130 is fabricated with conventional CMOS integrated circuit processing methods. Such CMOS processing permits conductive interconnections to selectively or optionally be open-circuited in accordance with metal mask options. Another method of selective interconnection is provided wherein conductive polycrystalline silicon links may be cut or burned open with a laser after all other CMOS integrated circuit wafer processing steps have been completed.

It is desirable that the identification code read-only circuit 130 be adapted to be programmable by either the metal mask option method or by the laser method. In the preferred embodiment, each of the eight UDB0 through UDB7 outputs of the identification code read-only circuit 130 is programmable by either method. Accordingly, the monolithic integrated circuit 52 can be personalized with a choice of one of 256 possible codes. For manufacturing test purposes (prior to such personalization) and for applications where personalized programming is not required, it is desirable that the identification code read-only circuit 130 provide a known predetermined code without any programming steps.

The identification code read-only circuit 130 includes metal links 180, 182, and 184 which are metal-mask programmable to either be conductive or open-circuited. If the metal links 180, 182, and 184 are programmed to be conductive, current flow through the respectively attached N-channel transistors 186, 188, 190 is not interrupted. Also included in the identification code read-only circuit 130 are polycrystalline silicon links 192, 194, and 196. Prior to any laser programming, the polycrystalline silicon links 192, 194, 196 will likewise not interrupt any current flow through the respective N-channel transistors 186, 188, 190. With both the metal link 180 and the polycrystalline silicon link 192 being conductive, because the width to length ratio of the N-channel transistor 186 is much larger than that of the P-channel transistor 198, the state of a node 200 will be a logic 0 irrespective of the state of a signal INIT applied to the gate of a P-channel transistor 198. Inverters 202, 204 are responsive to a logic 0 on the node 200 for producing a logic 0 on a line 206 which is coupled to the output of the inverter 204. With a logic 0 applied to the input of the N-channel transistor 190 via the line 206, the N-channel transistor 188 and a P-channel transistor 208 operate to cause the state of a node 210 to be a logic 1. An inverter 212 is responsive to a logic 1 on the node 210 for producing a logic 0 for the signal UDB0.

The metal links 182, 184, the N-channel transistors 188, 190, the polycrystalline silicon links 194, 196, the P-channel transistor 208, the inverter 212, and a P-channel transistor 216 comprise a programmable circuit 214.

There is an identical programmable circuit 214 for each of the outputs UDB1 through UDB7. In the same manner as for the signal UDB0, if all the metal links 180, 182, 184, and the polycrystalline silicon links 192, 194, 196 are conductive, each of the signals UDB1 through UDB7 will be a logic 0. Thus, without any programming steps an all 0's code is provided.

To program the programmable circuit 214, either the metal link 180 is made to be open-circuited or the polycrystalline silicon link 192 is opened in order that the N-channel transistor 186 cannot cause the node 200 to be at a logic 0. Instead, the node 200 is caused to become a logic 1 when an inverter 218, which is responsive to the signal E2, causes the P-channel transistor 198 to become conductive. Once the node 200 has become a logic 1 it will remain a logic 1 (so long as power is supplied to the monolithic integrated circuit 52) as a result of latching action of the inverter 202 and a P-channel transistor 220, independent of the signal E2. The inverters 202, 204 are responsive to a logic 1 on the node 200 for producing a logic 1 on the line 206. If it is desired that the output of the programmable circuit 214 be a logic 1, either the metal link 182 is programmed to be open-circuited or the polycrystalline silicon link 194 is opened. For these conditions the N-channel transistor 190 will cause the node 210 to be at a logic 0 and the output of the inverter 212 will accordingly be a logic 1.

If, however, either the metal link 180 or the polycrystalline silicon link 192 is opened and it is desirable that the programmable circuit 214 be programmed to provide a logic 0 at its output, either the metal link 184 is programmed to be open-circuited or the polycrystalline silicon link 196 is opened. For these conditions, the N-channel transistor 188 and the P-channel transistor 208 will cooperate to cause the node 210 to be a logic 1 and the output of the inverter 212 will accordingly be a logic 0.

For an alternative embodiment, rather than programming the metal link 180 to be open-circuited or causing the polycrystalline silicon link 192 to be opened, the threshhold voltage required to cause the N-channel transistor 186 to become conductive may be made programmable with ion implantation; that is, the N-channel transistor 186 can optionally be made to have a normal threshhold voltage or a threshhold voltage so high that it can never become conductive for any value of the voltage VCCO that is within the specified allowable range of operating voltage for the monolithic integrated circuit 52. In a similar manner, the threshhold voltage of the N-channel transistor 188 can be made programmable in lieu of programming the metal link 182 or the polycrystalline silicon link 194. And, likewise, the threshhold voltage of the N-channel transistor 190 can be made programmable in lieu of programming the metal link 184 or the polycrystalline silicon link 196.

The portable, non-volatile read/write memory module of the present invention and many of its attendant advantages will be readily understood from the foregoing description. It will be apparent that various changes may be made in the form, construction, and arrangement of the parts thereof without departing from the spirit and scope of the invention or sacrificing all of its material advantages.

What is claimed is:

1. A non-volatile read/write memory module for use in conjunction with a host electronic system, said host electronic system having a ground voltage-reference node and having a chip enable output node which provides a chip enable signal, comprising:
   a battery having first and second terminals;
   a monolithic integrated circuit including:
   a. a ground terminal coupled to said first battery terminal and adapted for removably making electrical connection to said ground voltage-reference node of said host electronic system;
   b. a chip enable input terminal adapted for removably making electrical connection to said chip enable output node of said host electronic system;
   c. a serially-accessible read/write data storage means for the storage and retrieval of data;
   d. chip enable means coupled to said chip enable input terminal and responsive to said chip enable signal for enabling the serial transfer of data to and from said data storage means; and
   e. electronic circuit means coupled to said ground terminal and to said second battery terminal and further coupled to said chip enable input terminal for automatically coupling either said second battery terminal or said chip enable input terminal as the source of power to said data storage means, said electronic circuit means including comparator and switching means for selecting as the source of power whichever of the chip enable input terminal or second battery terminal has the highest voltage; and
   a housing for supporting the battery and the integrated circuit, whereby a hand-held, portable module is provided.

2. A non-volatile read/write memory module for use in conjunction with a host electronic system, said host electronic system having a ground voltage-reference node and having a chip enable output node which provides a chip enable signal and having a primary power supply node, comprising:
   a battery having first and second terminals;
   a monolithic integrated circuit including:
   a. a ground terminal coupled to said first battery terminal and adapted for removably making electrical connection to said ground voltage-reference node of said host electronic system;
   b. a chip enable input terminal adapted for removably making electrical connection to said chip enable output node of said host electronic system;
   c. a serially-accessible read/write data storage means for the storage and retrieval of data;
   d. chip enable means coupled to said chip enable input terminal and responsive to said chip enable signal for enabling the serial transfer of data to and from said data storage means;
   e. a primary power supply input terminal adapted for removably making electrical connection to said primary power supply node of said host electronic system; and
   f. electronic circuit means coupled to said ground terminal and to said second battery terminal and further coupled to said chip enable input terminal and coupled to said primary power supply input terminal for automatically coupling either said second battery terminal or said chip enable input terminal or said primary power supply input terminal as the source of power to said data storage means, said electronic circuit means including comparator and switching means for selecting as the source of power: (1) the said primary power supply input terminal if the voltage of the said primary power supply input terminal is greater than that of the said second battery terminal, or (2) the said second battery terminal if the voltage of the said second battery terminal is greater than that of both the said primary power supply input terminal and the said chip enable input terminal, or (3) the said chip enable input terminal if the voltage of the said chip enable input terminal is greater than that of both the said primary power supply input terminal and the said second battery terminal; and a housing for supporting the battery and the integrated circuit, whereby a hand-held, portable module is provided.

3. A non-volatile read/write memory module for use in conjunction with a host electronic system, said host electronic system including serial data generation means for providing a sequence of data bits, comprising:

a battery having first and second terminals;

a monolithic integrated circuit coupled to said first and second terminals of said battery for receiving standby power from said battery and including:
  a. a serially-accessible read/write data storage means for the storage and retrieval of data; and
  b. control logic means for controlling the serial transfer of data to and from said data storage means, said control logic means including:
    i. a data input adapted for serially receiving data bits from said host electronic system;
    ii. serial register means coupled to said data input for serially storing a sequence of data bits received by said data input;
    iii. read-only circuit means for providing a predetermined bit code, wherein said bit code comprises a plurality of data bits that are not electrically alterable after once having been programmed;
    iv. comparison means coupled to said serial register means and coupled to said read-only circuit means for comparing a sequence of data bits stored in said serial register means to said predetermined bit code and for generating a comparison signal that is indicative of whether the said sequence of data bits matches said predetermined bit code; and
    v. circuit means responsive to said comparison signal for enabling the writing and reading of data to and from said data storage means; and a housing for supporting the battery and the integrated circuit, whereby a hand-held, portable module is provided.

4. The module according to claim 1 wherein said monolithic integrated circuit and said host electronic system are electrically connected by no more than five electrical connectors.

5. The module according to claim 2 wherein said monolithic integrated circuit and said host electronic system are electrically connected by no more than five electrical connectors.

6. The module according to claim 3 wherein said monolithic integrated circuit and said host electronic system are electrically connected by no more than five electrical connectors.

* * * * *